United States Patent
Tu

(10) Patent No.: US 11,888,099 B2
(45) Date of Patent: Jan. 30, 2024

(54) LED PACKAGE STRUCTURE

(71) Applicant: Lextar Electronics Corporation, Hsinchu (TW)

(72) Inventor: Chien-Hsin Tu, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 294 days.

(21) Appl. No.: 17/386,561

(22) Filed: Jul. 28, 2021

(65) Prior Publication Data

US 2022/0140208 A1 May 5, 2022

(30) Foreign Application Priority Data

Nov. 2, 2020 (CN) .......................... 202011201328.1

(51) Int. Cl.
*H01L 33/58* (2010.01)
*H01L 33/50* (2010.01)
*H01L 33/48* (2010.01)

(52) U.S. Cl.
CPC ............ *H01L 33/58* (2013.01); *H01L 33/483* (2013.01); *H01L 33/50* (2013.01)

(58) Field of Classification Search
CPC ....... H01L 33/58; H01L 33/483; H01L 33/50; H01L 33/52
See application file for complete search history.

(56) References Cited

U.S. PATENT DOCUMENTS 10,141,488 B2 11/2018 Nakabayashi
2012/0181559 A1* 7/2012 Park ........................ H01L 33/58
257/E33.061

FOREIGN PATENT DOCUMENTS

TW 201503422 A * 1/2015
TW 201503422 A 1/2015

* cited by examiner

*Primary Examiner* — Jay C Chang
*Assistant Examiner* — Mikka Liu
(74) *Attorney, Agent, or Firm* — CKC & Partners Co., LLC

(57) ABSTRACT

A light emitting diode (LED) package structure include an electrically-insulated frame, a trough, a LED chip, a fluorescent colloid and at least two spacing members. The electrically-insulated frame has a surface with four corners. The trough is recessed in the surface. The LED chip is located in the trough. The fluorescent colloid is filled within the trough to cover the LED chip. The spacing members protrude from two of the four corners on the surface, wherein a glue escape gap is defined between each spacing member and a boundary of the trough.

16 Claims, 8 Drawing Sheets

LED PACKAGE STRUCTURE

CROSS-REFERENCE TO RELATED APPLICATION

This application claims priority to China Application Serial Number 202011201328.1, filed Nov. 2, 2020, which is herein incorporated by reference in its entirety.

BACKGROUND

Field of Invention

The present disclosure relates to a light emitting diode (LED) package structure.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

When the light emitting diode is used as a backlight source for a display device, e.g. a thin film transistor-liquid crystal display, how to reduce the uneven brightness of the backlight module is a problem that various suppliers would like to solve.

SUMMARY

One aspect of the present disclosure is to provide a light emitting diode (LED) package structure, which includes an electrically-insulated frame, a trough, a LED chip, a fluorescent colloid and at least two spacing members. The electrically-insulated frame has a surface with four corners. The trough is recessed in the surface. The LED chip is located in the trough. The fluorescent colloid is filled within the trough to cover the LED chip. The spacing members protrude from two of the four corners on the surface, wherein a glue escape gap is defined between each spacing member and a boundary of the trough.

Another aspect of the present disclosure is to provide a light emitting module including a light guide plate and a light emitting diode (LED) package structure. The light emitting diode (LED) package structure includes an electrically-insulated frame, a trough, a LED chip, a fluorescent colloid and at least two spacing members. The electrically-insulated frame has a surface with four corners. The trough is recessed in the surface. The LED chip is located in the trough. The fluorescent colloid is filled within the trough to cover the LED chip. The spacing members protrude from two of the four corners on the surface, wherein a glue escape gap is defined between each spacing member and a boundary of the trough. The at least two spacing members are in contact with the sidewall of the light guide plate.

In one or more embodiments, the at least two spacing members have the same height.

In one or more embodiments, the glue escape gap is equal to a sidewall thickness of the electrically-insulated frame.

In one or more embodiments, the surface is a rectangle, and the at least two spacing members are located at a pair of corners of the rectangle.

In one or more embodiments, one of the four corners is a location-recognized corner, and the at least two spacing members are located at remaining corners of the four corners except the location-recognized corner.

In one or more embodiments, each spacing member is a triangular column.

In one or more embodiments, each spacing member is a hemisphere.

In one or more embodiments, each spacing member is a long bar.

In one or more embodiments, each spacing member is a pyramid.

In summary, the light-emitting diode package disclosed herein maintains an appropriate distance from a sidewall of the light guide plate by means of its spacing member to prevent the fluorescent colloid from directly adhering to the sidewall of the light guide plate and affecting a uniform performance of the light guide plate. In addition, at least a glue escape gap between each spacing member and the fluorescent colloid in the package prevents the fluorescent colloid from spreading to the sidewall of the light guide plate through the spacing member, which can effectively improve the uneven brightness phenomenon of the backlight module caused by an overflow of the fluorescent colloid.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
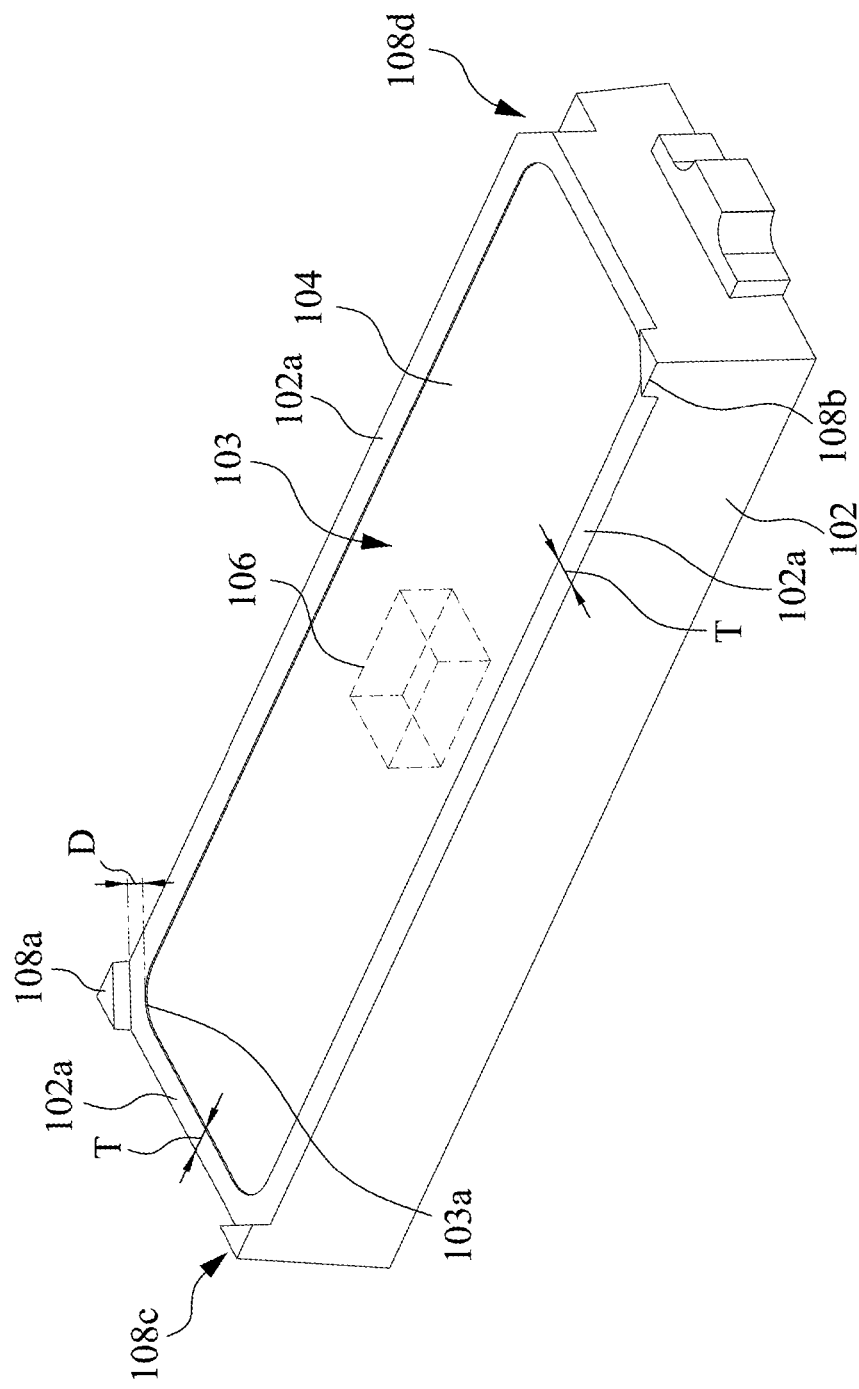
FIG. 1 illustrates a perspective view of an LED package structure in accordance with an embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals.

Figure 2:
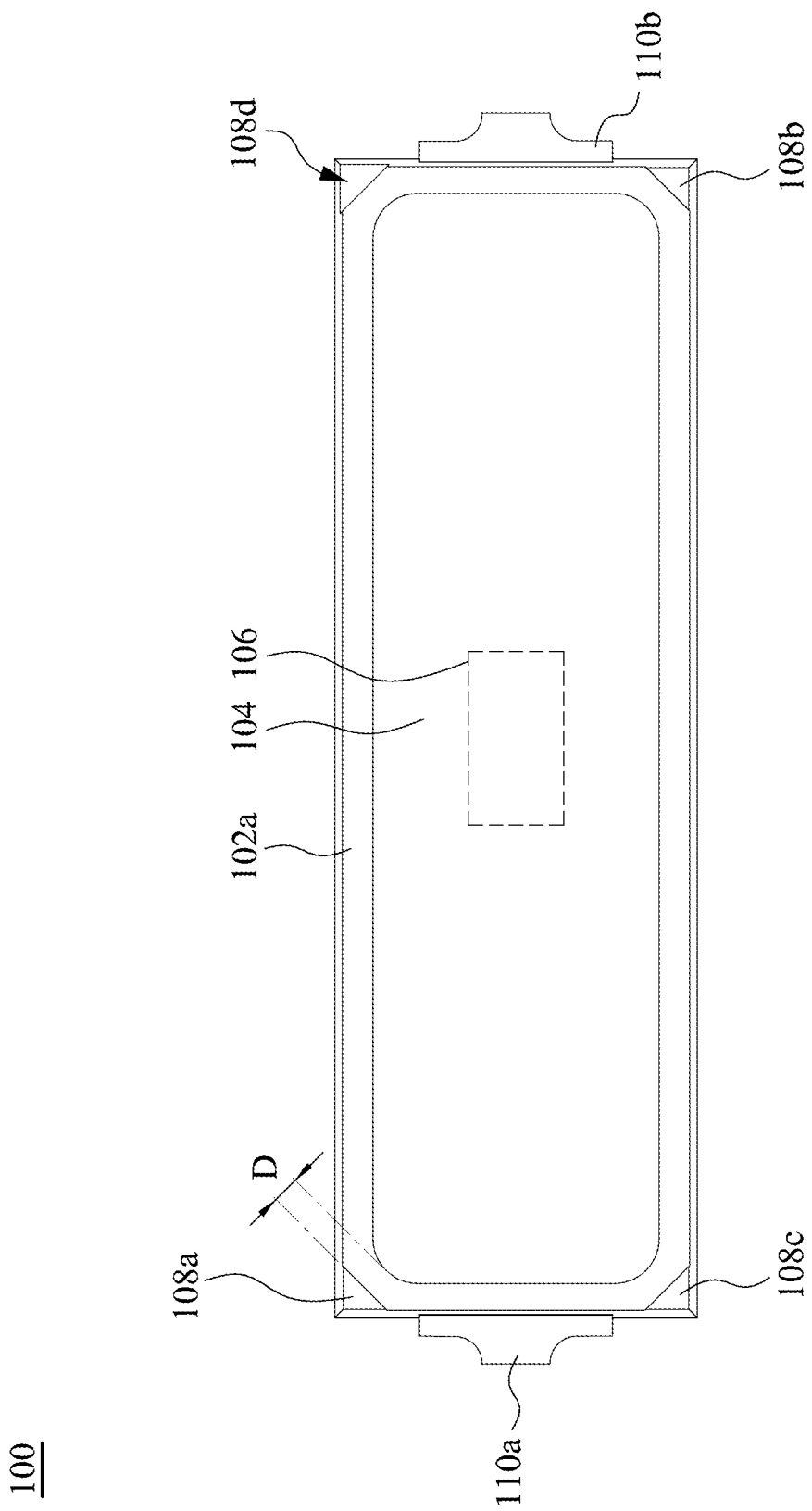
FIG. 2 illustrates a top view of the LED package structure in FIG. 1.
Figure 3:
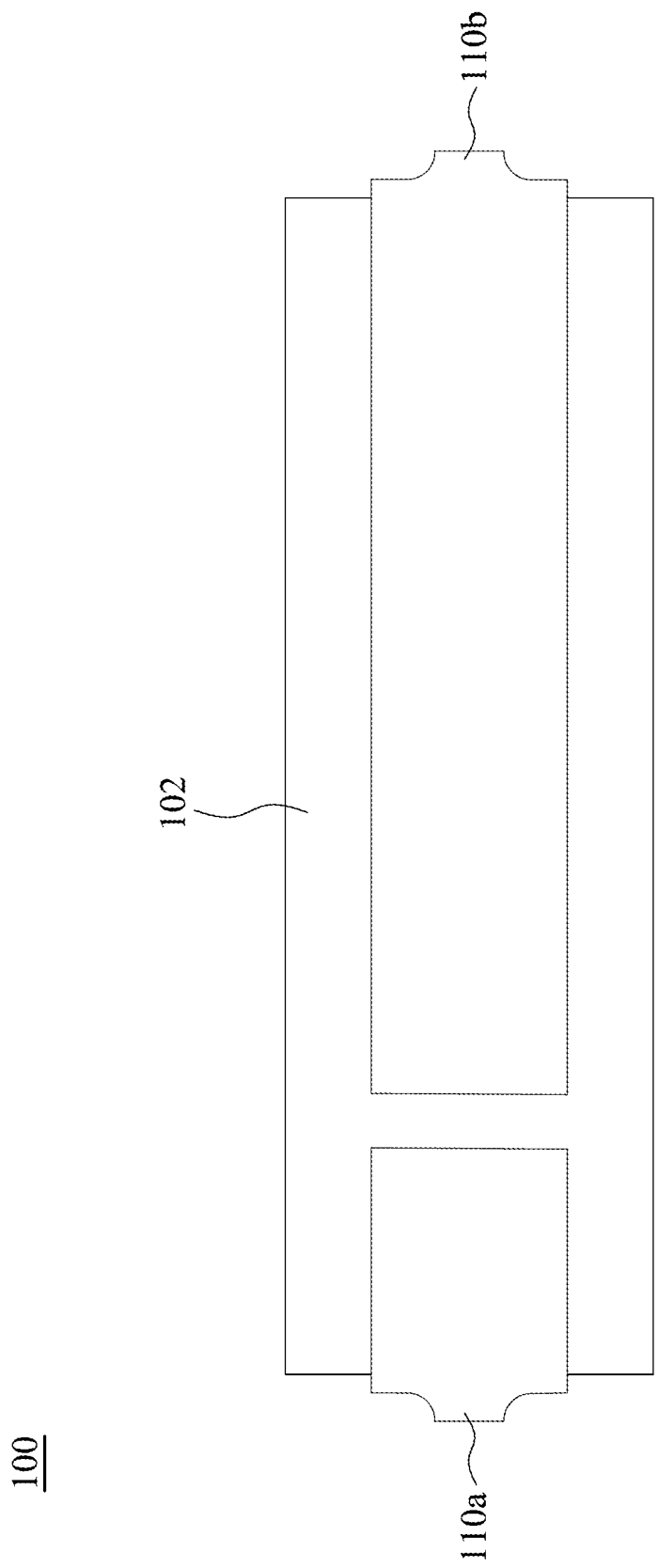
FIG. 3 illustrates a bottom view of the LED package structure in FIG. 1.
Figure 4:
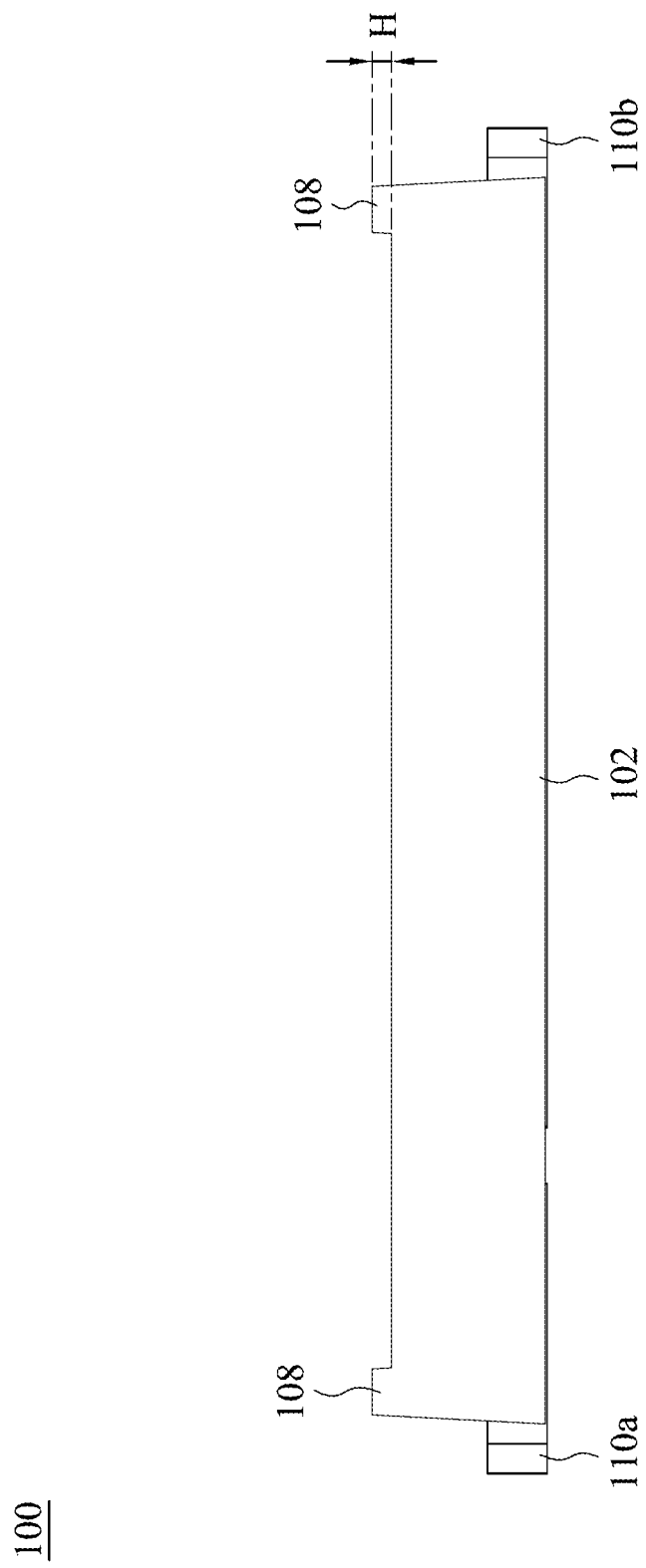
FIG. 4 illustrates a side view of the LED package structure in FIG. 1.

Reference is made to FIGS. 1-4. FIG. 1 illustrates a perspective view of an LED package structure in accordance with an embodiment of the present disclosure, FIG. 2 illustrates a top view of the LED package structure in FIG. 1, FIG. 3 illustrates a bottom view of the LED package structure in FIG. 1, and FIG. 4 illustrates a side view of the LED package structure in FIG. 1. When an LED package structure 100 is attached to a sidewall of the light guide plate (such as the configuration in FIG. 5) to form a light emitting module, the light guide plate will have uneven light emission, which is confirmed to be a fluorescent colloid that moves and sticks to the sidewall of the light guide plate based on the siphon principle by repeated tests of the present invention. In order to reduce the chance of the fluorescent colloid sticking to the light guide plate, the LED package structure of the present invention is proposed.

The LED package structure 100 includes an electrically-insulated frame 102, an LED chip 106, and a fluorescent colloid 104. The electrically-insulated frame 102 has a surface 102a (for example, an upper surface or a top surface). The surface 102a is approximately quadrilateral or rectangular, and has four corners. The electrically-insulated frame 102 has a trough 103 recessed from the surface 102a. The LED chip 106 is located in the trough 103 and is electrically connected to two lead frames (110a, 110b). The fluorescent colloid 104 is filled in the trough 103 and covers the LED chip 106. At least two spacing members (108a, 108b, 108c) protrude from two of the four corners of the surface 102a, and a glue escape gap D is formed between each spacing member (108a, 108b, 108c) and a border or boundary 103a of the trough 103. There is at least a glue escape gap D between each spacing member (108a, 108b, 108c) and the fluorescent colloid 104 in the trough 103 to prevent the fluorescent colloid 104 from spreading to other areas through the spacing member.

In some embodiments of the present disclosure, the spacing members (108a, 108b) are located at a pair of opposite corners of a rectangle, but not being limited thereto.

In some embodiments of the present disclosure, each spacing member (108a, 108b, 108c) can be a triangular column, but not being limited thereto.

In some embodiments of the present disclosure, the spacing member is not located at a location-recognized corner 108d, but located at remaining corners of the four corners except the location-recognized corner 108d, but not being limited thereto. In some embodiments of the present disclosure, the location-recognized corner 108d is a triangular cut corner or recessed corner.

A height H is used to prevent the fluorescent colloid from directly sticking to the light guide plate. Therefore, the height H should be greater than a protrusion tolerance value of the fluorescent colloid 104 filled with the trough 103 (i.e., an tolerance value of the protrusion surface 102a), so as to reduce the chance of the fluorescent colloid 104 directly sticking to the light guide plate. In some embodiments of the present disclosure, the spacing members (108a, 108b, 108c) have the same height H, but not being limited thereto. In some embodiments of the present disclosure, the height H may be in the range of 0.05 mm to 0.15 mm, but not being limited thereto.

The glue escape gap D is used to prevent the fluorescent colloid from spreading and sticking to the light guide plate through the spacing member. Therefore, the glue escape gap D should be greater than an overflow tolerance value from the border or boundary 103a of the fluorescent colloid 104 filled into the trough 103. In some embodiments of the present disclosure, the glue escape gap D can be equal to a sidewall thickness T of the electrically-insulated frame 102, but not being limited thereto.

In some embodiments of the present disclosure, the electrically-insulated frame 102 may have a sidewall thickness T ranging from 0.12 mm to 0.22 mm, but not being limited thereto.

In some embodiments of the present disclosure, the glue escape gap D may range from 0.10 mm to 0.20 mm, but not being limited thereto.

Figure 5:
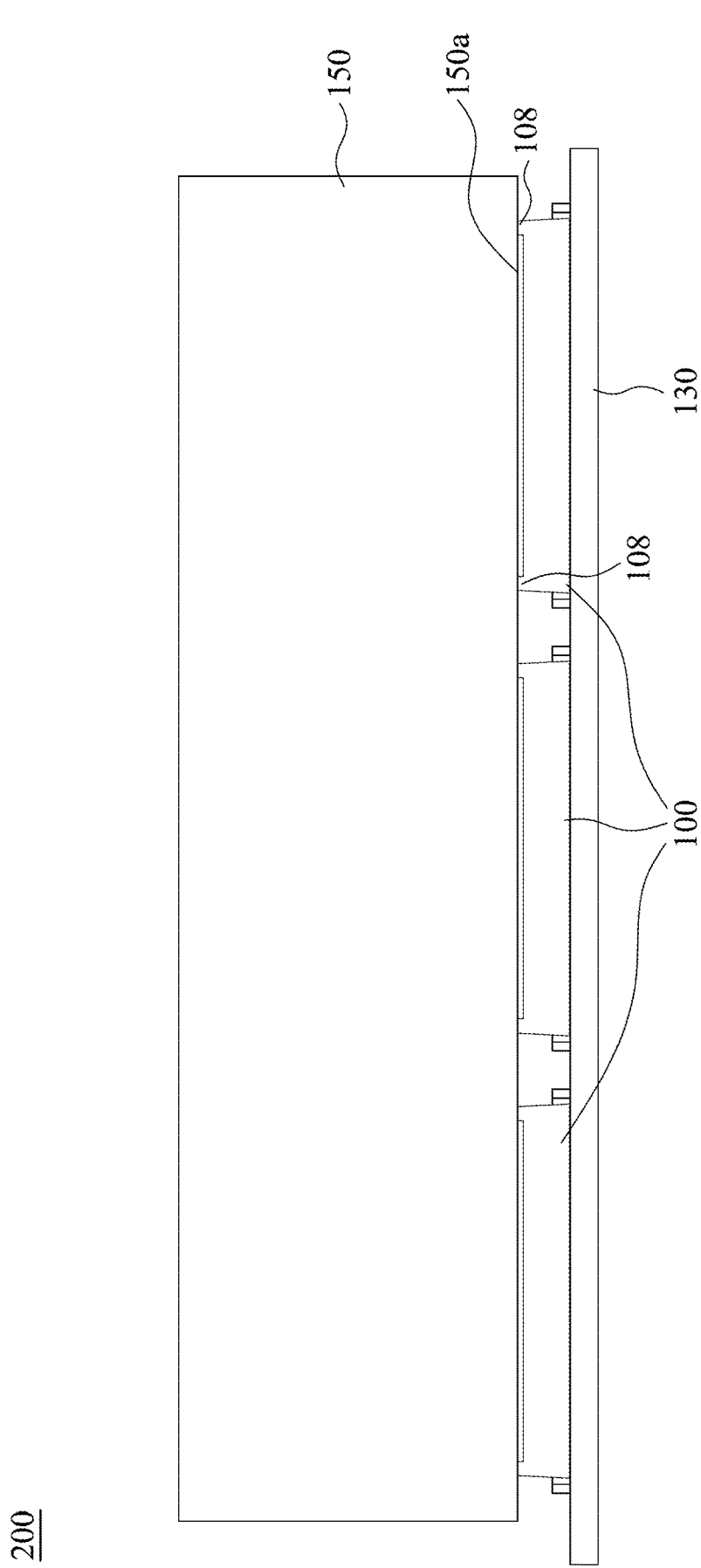
FIG. 5 illustrates a top view of a light emitting module in accordance with an embodiment of the present disclosure.

In some embodiments of the present disclosure, the two lead frames (110a, 110b) are exposed from a bottom surface or a lower surface of the electrically-insulated frame 102 and protrude from a sidewall of the electrically-insulated frame 102 to facilitate soldering on the circuit board (for example, the circuit board 130 in FIG. 5).

Reference is made to FIG. 5, which illustrates a top view of a light emitting module in accordance with an embodiment of the present disclosure. The light emitting module 200 includes a light guide plate 150 and a plurality of LED package structures 100. The LED package structures 100 are arranged on the circuit board 130, and the spacing member 108 thereof abuts against a sidewall 150a of the light guide plate 150. Therefore, the fluorescent colloid in each LED package structure 100 is maintained at an appropriate distance from the sidewall 150a of the light guide plate 150 through the spacing member 108 to prevent the fluorescent colloid from sticking to the sidewall 150a of the light guide plate 150 and affecting a uniform performance of the light guide plate 150.

Figure 6:
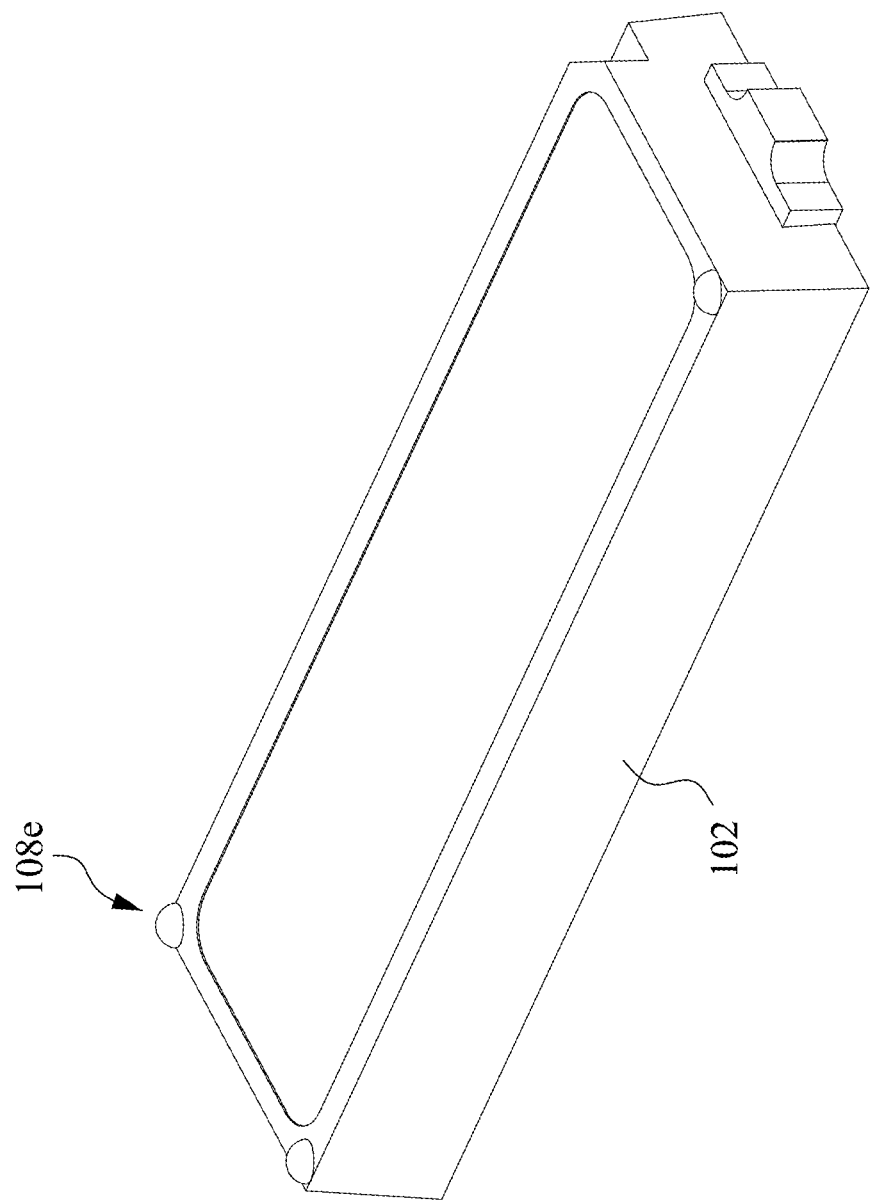
FIG. 6 illustrates a perspective view of an LED package structure in accordance with another embodiment of the present disclosure.

Reference is made to FIG. 6, which illustrates a perspective view of an LED package structure 100a in accordance with another embodiment of the present disclosure. The LED package structure 100a is different from the aforementioned LED package structure 100 mainly in the structure of the spacing member. The light emitting diode package 100a has three corners in which a plurality of hemispherical spacing members 108e (i.e., a hemisphere) are located, and the function of the spacing member 108e is the same as that of the aforementioned spacing member.

Figure 7:
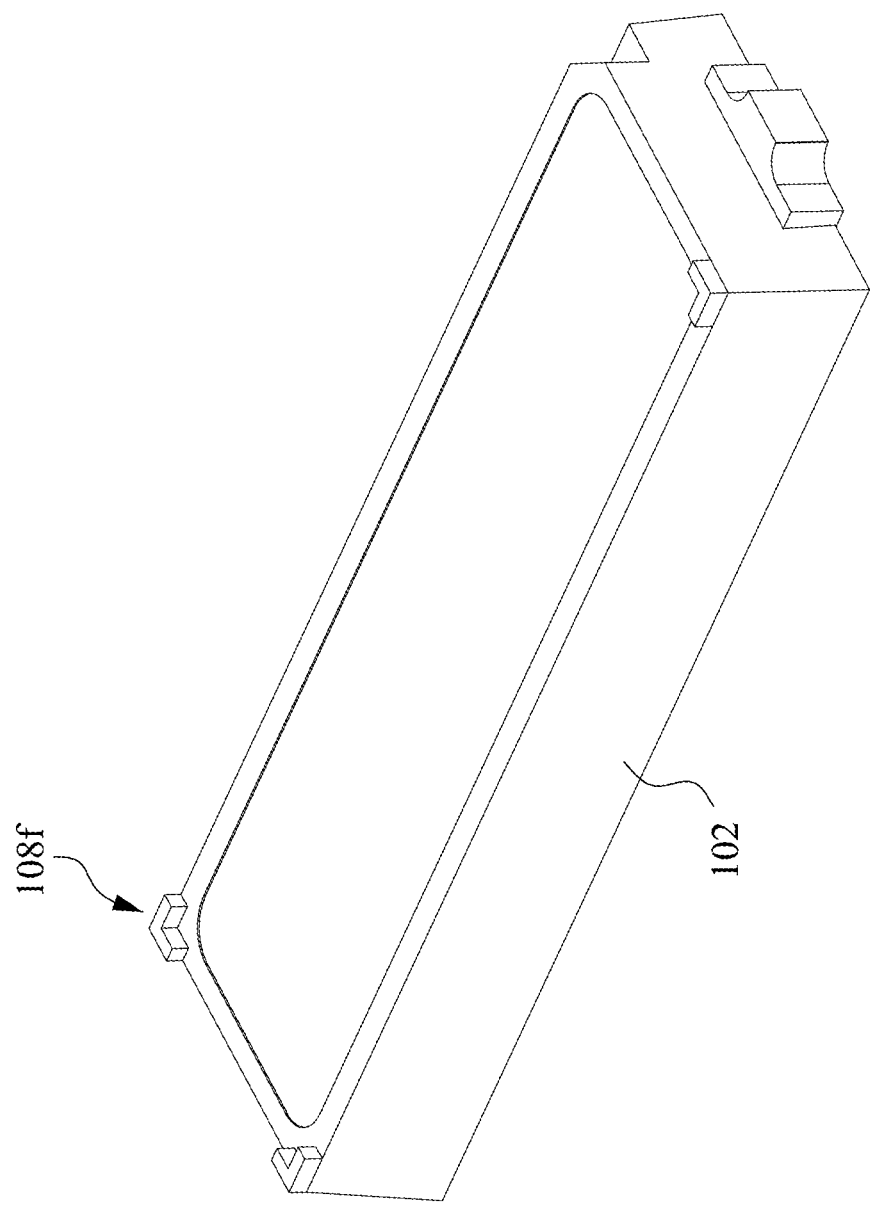
FIG. 7 illustrates a perspective view of an LED package structure in accordance with still another embodiment of the present disclosure.

Reference is made to FIG. 7, which illustrates a perspective view of an LED package structure 100b in accordance with still another embodiment of the present disclosure. The LED package structure 100b is different from the aforementioned LED package structure 100 mainly in the structure of the spacing member. The light emitting diode package 100b has a plurality of elongated spacing members 108f (i.e., a long bar) at three corners therein, and the function of the spacing member 108f is the same as that of the aforementioned spacing member.

Figure 8:
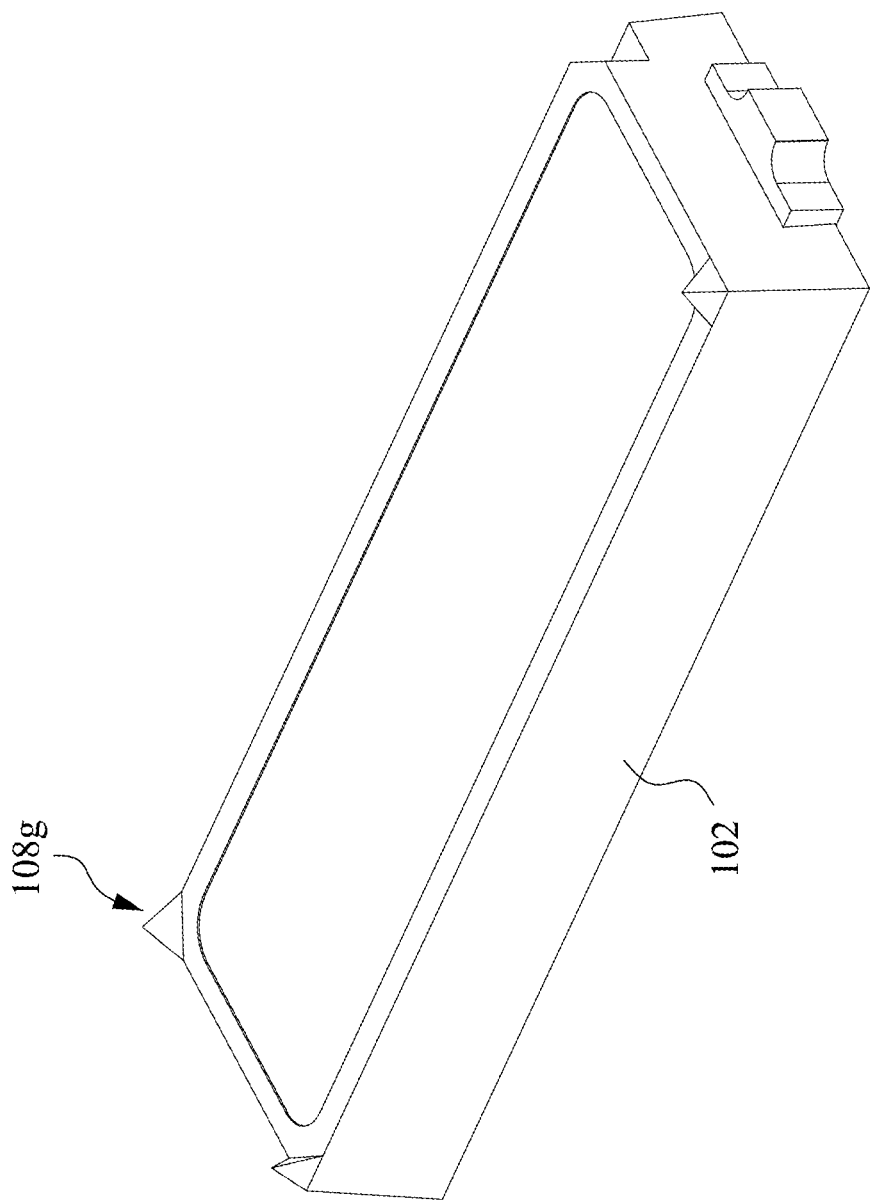
FIG. 8 illustrates a perspective view of an LED package structure in accordance with still another embodiment of the present disclosure.

Reference is made to FIG. 8, which illustrates a perspective view of an LED package structure 100c in accordance with still another embodiment of the present disclosure. The LED package structure 100c is different from the aforementioned LED package structure 100 mainly in the structure of the spacing member. The light emitting diode package 100c has a plurality of pyramidal spacing members 108g (i.e., pyramids) at three corners therein, and the function of the spacing member 108g is the same as that of the aforementioned spacing member.

In summary, the light-emitting diode package disclosed herein maintains an appropriate distance from a sidewall of the light guide plate by means of its spacing member to prevent the fluorescent colloid from directly adhering to the sidewall of the light guide plate and affecting a uniform performance of the light guide plate. In addition, at least a glue escape gap between each spacing member and the fluorescent colloid in the package prevents the fluorescent colloid from spreading to the sidewall of the light guide plate through the spacing member, which can effectively improve the uneven brightness phenomenon of the backlight module caused by an overflow of the fluorescent colloid.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode (LED) package structure comprising:
    an electrically-insulated frame having a surface, wherein the surface has four corners;
    a trough recessed in the surface;
    an LED chip disposed in the trough;
    a fluorescent colloid filled within the trough and covering the LED chip; and
    at least two spacing members protruding from two of the four corners on the surface, wherein a glue escape gap is defined between each spacing member and a boundary of the trough, wherein one of the four corners is a location-recognized corner, and the at least two spacing members are located at remaining corners of the four corners except the location-recognized corner.

2. The LED package structure of claim 1, wherein the at least two spacing members have a same height.

3. The LED package structure of claim 1, wherein the glue escape gap is equal to a sidewall thickness of the electrically-insulated frame.

4. The LED package structure of claim 1, wherein the surface is a rectangle, and the at least two spacing members are located at a pair of corners of the rectangle.

5. The LED package structure of claim 1, wherein each spacing member comprises a triangular column.

6. The LED package structure of claim 1, wherein each spacing member comprises a hemisphere.

7. The LED package structure of claim 1, wherein each spacing member comprises a long bar.

8. The LED package structure of claim 1, wherein each spacing member comprises a pyramid.

9. A light emitting module comprising:
    a light guide plate; and
    a light emitting diode (LED) package structure disposed adjacent to a sidewall of the light guide plate, wherein the LED package structure comprises:
    an electrically-insulated frame having a surface, wherein the surface has four corners;
    a trough recessed in the surface;
    an LED chip disposed in the trough;
    a fluorescent colloid filled within the trough and covering the LED chip; and
    at least two spacing members protruding from two of the four corners on the surface, wherein a glue escape gap is defined between each spacing member and a boundary of the trough,
    wherein the at least two spacing members are in contact with the sidewall of the light guide plate,
    wherein one of the four corners is a location-recognized corner, and the at least two spacing members are located at remaining corners of the four corners except the location-recognized corner.

10. The light emitting module of claim 9, wherein the at least two spacing members have a same height.

11. The light emitting module of claim 9, wherein the glue escape gap is equal to a sidewall thickness of the electrically-insulated frame.

12. The light emitting module of claim 9, wherein the surface is a rectangle, and the at least two spacing members are located at a pair of corners of the rectangle.

13. The light emitting module of claim 9, wherein each spacing member comprises a triangular column.

14. The light emitting module of claim 9, wherein each spacing member comprises a hemisphere.

15. The light emitting module of claim 9, wherein each spacing member comprises a long bar.

16. The light emitting module of claim 9, wherein each spacing member comprises a pyramid.

* * * * *